United States Patent
Matsubara (10) Patent No.: US 6,240,048 B1
(45) Date of Patent: May 29, 2001

(54) SYNCHRONOUS TYPE SEMICONDUCTOR MEMORY SYSTEM WITH LESS POWER CONSUMPTION

(75) Inventor: Yasushi Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/603,508

(22) Filed: Jun. 26, 2000

(30) Foreign Application Priority Data

Jun. 29, 1999 (JP) .................................................. 11-183978

(51) Int. Cl.[7] ...................................................... G11C 8/00
(52) U.S. Cl. ...................... 365/233; 365/227; 365/189.05
(58) Field of Search .................................. 365/233, 226, 365/227, 189.09, 189.05, 194, 230.06, 189.01

(56) References Cited

U.S. PATENT DOCUMENTS

| | | | |
|---|---|---|---|
| 5,623,453 | * 4/1997 | Shinozaki | 365/233 |
| 6,021,082 | * 2/2000 | Shirai | 365/226 |
| 6,088,290 | * 7/2000 | Ohtake et al. | 365/233 |
| 6,144,613 | * 11/2000 | Matsubara | 365/233 |
| 6,166,990 | * 12/2000 | Ooshi et al. | 365/233 |

FOREIGN PATENT DOCUMENTS

| | | |
|---|---|---|
| 7-505244 | 6/1995 | (JP) . |
| 7-177015 | 7/1995 | (JP) . |
| 8-273355 | 10/1996 | (JP) . |
| 6-69285 | 3/1997 | (JP) . |
| 11-66842 | 3/1999 | (JP) . |
| 11-66849 | 3/1999 | (JP) . |

* cited by examiner

Primary Examiner—David Nelms
Assistant Examiner—Gene N. Auduong (57) ABSTRACT

A synchronous type dynamic random access memory (SDRAM) includes a memory cell array section having an address decoder section and a sense amplifier section, a power down signal generating section, a control signal generating section and an accessing section. The power down signal generating section generates a first power down signal and a second power down signal based on a clock enable signal, an external clock signal, a signal specific to the SDRAM and a write burst signal. The first power down signal is inactive during a predetermined time period synchronous with the specific signal, and the second power down signal is inactive during the predetermined time period and during a time period during which the write burst signal is supplied. The control signal generating section generates a control signal based on a command signal when the first power down signal is inactive. The accessing section accesses the memory cell array section based on an external address signal and an external data signal in response to the control signal when the first power down signal or the second power down signals is inactive.

20 Claims, 7 Drawing Sheets

SYNCHRONOUS TYPE SEMICONDUCTOR MEMORY SYSTEM WITH LESS POWER CONSUMPTION

BACKGROUND OF THE INVENTION

1. Field of the Invention

The present invention relates to a semiconductor device with a power saving function.

2. Description of the Related Art

Very recently, synchronous DRAMs (Dynamic Random Access Memories) capable of achieving high-speed access operations and high data bandwidths have been marketed in 16-Mbit generation and further 64-Mbit generation. In such a synchronous DRAM, all of memory operations thereof are performed in synchronous with a external clock signal CLK. Also, the synchronous DRAM is typically provided with a power down mode to reduce current consumption of an input buffer.

Figure 1:
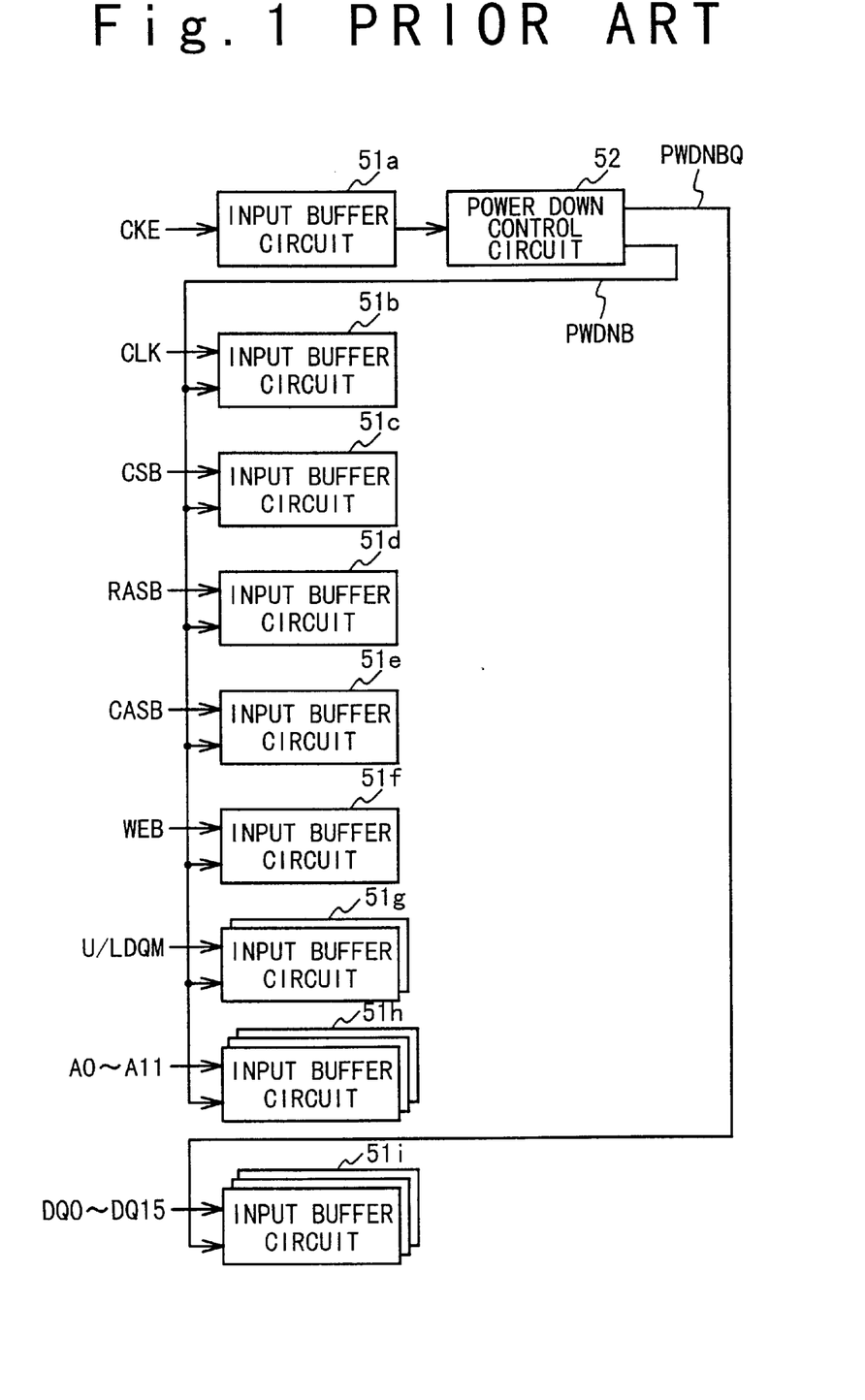
FIG. 1 is a block diagram showing the structure of a conventional synchronous type semiconductor memory (synchronous DRAM)

FIG. 1 is a diagram showing the structure of a conventional synchronous DRAM with such a power down mode. Referring to FIG. 1, in this conventional synchronous DRAM circuit, a clock signal CLK is supplied to an input buffer circuit 51b, a chip select signal CSB is supplied to another input buffer circuit 51c, and a row address strobe signal RASB is supplied to another input buffer circuit 51d. Also, a column address strobe signal CASB is supplied to another input buffer circuit 51e, and a write enable signal WEB is supplied to a further input buffer circuit 51f. Address signals A0 to A11 are supplied to the input buffer circuit 51h, and data signals DQ0 to DQ15 are supplied to the input buffer circuit 51i.

A combination of three types of signals such as the row address strobe signal RASB, the column address strobe signal CASB, and the write enable signal WEB gives one of various types of commands. For example, a data write command CMD and a data read command (CMD) may be applied to an SDRAM. The address signals A0 to A11 are applied in combination with commands CMDs, so that addresses of memory cells are designated. Furthermore, a mask signal U/LDQM is supplied to the input buffer circuit 51g. This mask signal U/LDQM causes the data D0 to D15 not to be read out from the SDRAM, or causes the data D0 to D15 not to be written into the SDRAM.

On the other hand, a clock enable signal CKE is supplied via another input buffer circuit 51a to a power down control circuit 52. In response to the clock enable signal CKE, the power down control circuit 52 generates power down signals PWDNB and PWDNBQ. The power down signal PWDNB is supplied to these input buffer circuits 51b, 51c, 51d, 51e, 51f, 51g and 51h, whereas the power down signal PWDNBQ is supplied to another input buffer circuit 51i.

Figure 4:
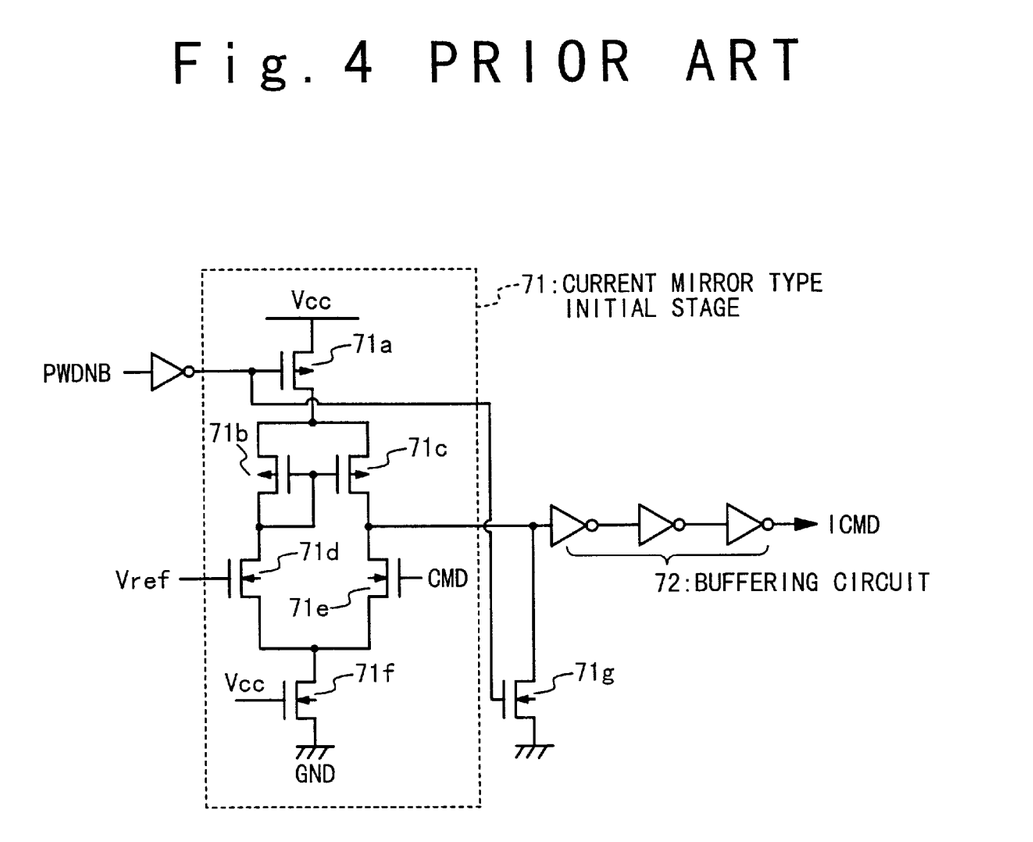
FIG. 4 is a circuit diagram showing an example of an input buffer circuit used in the conventional synchronous type semiconductor memory.

As shown in FIG. 4, each of the input buffer circuits 51b to 51h of each of the SDRAMs is composed of a current mirror type pre-stage circuit 71 and a buffering circuit 72. When the power down signal PWDNB is in a high level, the current mirror type pre-stage circuit 71 is set to an active state. Conversely, when the power down signal PWDNB is in a low level, the current mirror type pre-stage circuit 71 is set to a power down state. The current mirror type pre-stage circuit 71 operating in the active state continuously consumes a current passing from a power supply potential Vcc to the ground potential GND through P-channel type transistors 71a, 71b, and 71c and N-channel type transistors 71d, 71e, and 71f. The passing-through current will be referred to as a "DC current" hereinafter. Symbol "Vref" indicates a reference signal used to determine whether a level of a command CMD is in a low level or a high level. The level of the reference signal Vref is in an intermediate level between the power supply potential Vcc and the groudn potential GND. The buffering circuit 72 is provided to transfer a command CMD with a high level or a low level to an internal circuit of the SDRAM. The buffering circuit 72 operates only when the current mirror type pre-stage circuit 71 is set to the active state, and consumes a current when the level of the command CMD is switched from the high level to the low level, or vice versa. The current consumed by the buffering circuit 72 at that time will be referred to as an "AC current" hereinafter.

Now, a current consumption condition in the conventional synchronous type semiconductor memory system will be described below. As shown in FIG. 1, each of these SDRAMs determines whether the power down signal PWDNB supplied from the power down control circuit 52 is in the high level or the low level, depending on the input state of the clock enable signal CKE. That is, when the clock enable signal CKE is in the high level, the power down signal PWDNB becomes the high level, so that the input buffer circuit operate. Conversely, when the clock enable signal CKE is in the low level, the power down signal PWDNB becomes the low level, so that the input buffer circuit does not operate. The data signals DQ0 to DQ15 shown in FIG. 1 are supplied with the power down signal PWDNBQ which is a inversion signal of the power down signal PWDNB. Even if the clock enable signal CKE is in the high level, the power down signal PWDNBQ becomes the low level. Therefore, when a reading command CMD is supplied, the data signals DQ0 to DQ15 can be accessed.

Figure 2:
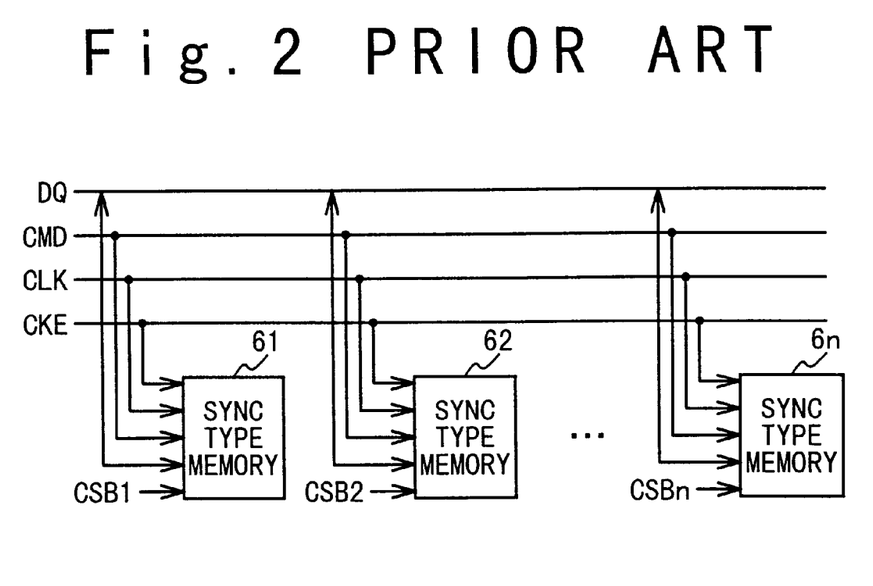
FIG. 2 is a block diagram showing the structure of a conventional memory system in which n synchronous type semiconductor memories are mounted.

FIG. 2 shows an example of an arrangement of a memory system in which n SDRAMs each having the structure shown in FIG. 1 are mounted. As shown in FIG. 2, a plurality of SDRAMs 61 to 6n are provided in a memory system. A chip select signal CSB is supplied to specify one of the SDRAMs for a command CMD to be applied. It should be noted that an address signal A, a mask signal U/LDQMB, a data signal DQ, a command CMD, a clock CLK, and a clock enable signal CKE are commonly used to the n SDRAMs 61 to 6n. As an exceptional case, the respective SRAMs has the specific signal lines for the chip select signals CSB. Thus, the respective chip select signals CSB1 to CSBn are supplied to the respective SDRAMs 61 to 6n.

Figure 3A:
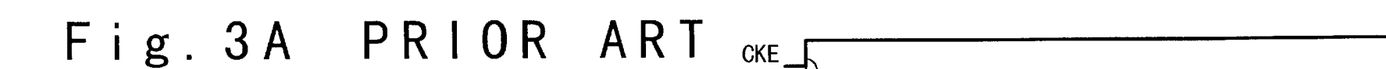
FIGS. 3A to 3G are timing charts showing the operation of the conventional memory system shown in FIG. 2.
Figures 3B, 3C, 3D:
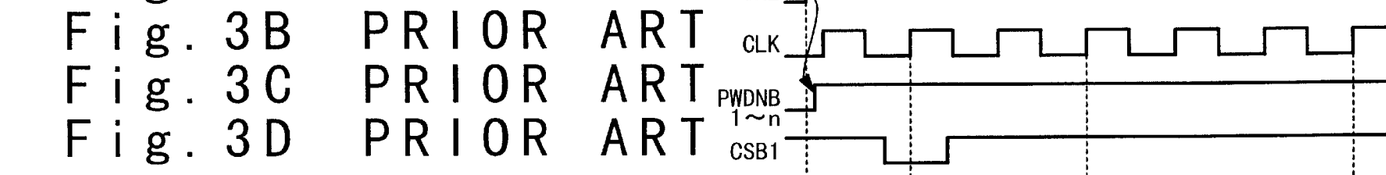
Figure 3E:
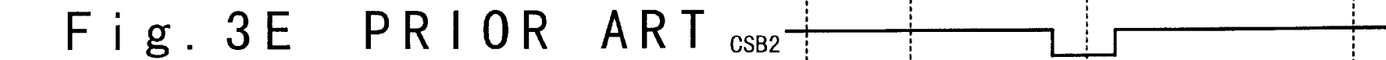
Figures 3F, 3G:
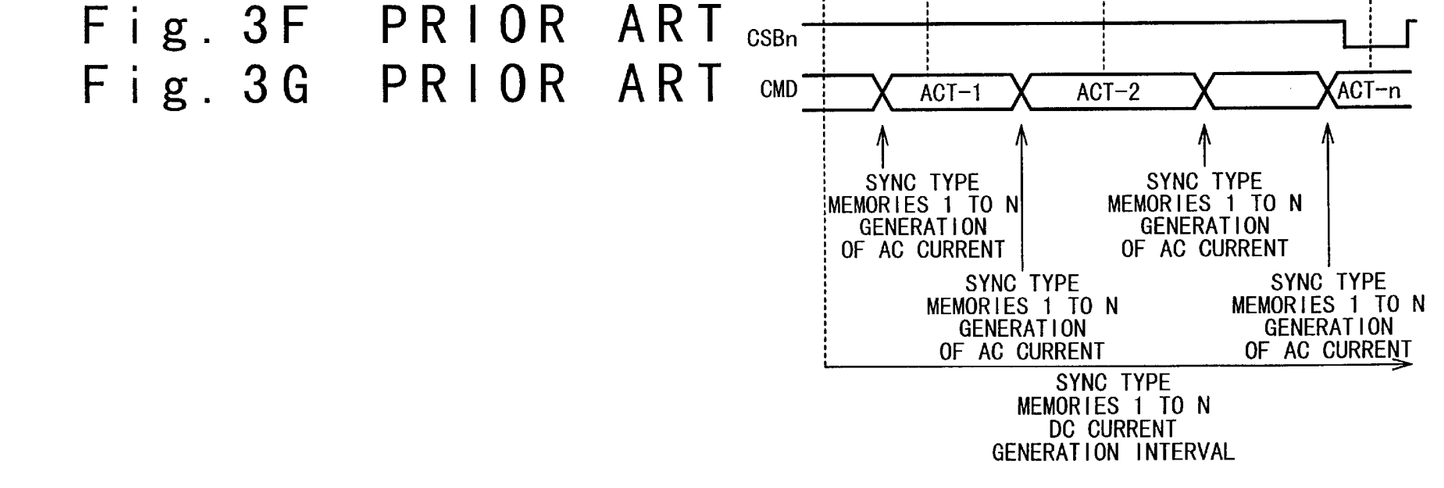

FIGS. 3A to 3G are timing charts showing an example of operations of the SDRAM memory system. When the level of the clock signal CKE becomes high as shown in FIG. 3A, the power down signals PWDNB1 to PWDNBn for synchronous type memories 61 to 6n become high as shown in FIG. 3C. In case that a command CMD of "ACT-1" shown in FIG. 3G is applied to the synchronous type memory 61, the chip select signal CSB1 is set to a low level. When the clock signal CLK for the chip select signal CSB1 is in the high level, the command CMD of "ACT-1" is applied to the SDRAM 61 only while the chip select signal CSB becomes a low level. Similarly, when a command of "ACT-2" shown in FIG. 3E is applied to the synchronous type memory 62, the chip select signal CSB2 becomes low. Other synchronous type memories are controlled in a similar manner. At that time, the synchronous type memories 61 to 6n continuously consume a DC current while the clock enable signal CKE is in the high level, and also the power down signals PWDNB1 to PWDNBn become high. Also, when the command CMD is switched between the high level and the low level, an AC current is consumed in the synchronous type memories 61 to 6n, irrespective of the DC current.

In this way, in the conventional SDRAM system, although a command is applied to one of SDRMs of the memory system, other SDRAMs also consume currents.

In conjunction with the above description, a power cutting circuit for a synchronous semiconductor device is disclosed in Japanese Laid Open Patent Application (JP-A-Heisei 7-177015). In this reference, a power cutting circuit (11, 12, 13 and 14) cuts the power supplied to an input initial stage circuit connected to external input/output pin in a standby state or in a reading operation. Also, when an input is supplied to another input pin to make the output of the external input/output pin invalid, the power cutting circuit powers on the input initial stage circuit. Thus, consumption current is reduced by cutting the power supplied to the input initial stage circuit in a mode other than a power down mode in a synchronous-type DRAM.

Also, a power down memory control unit is disclosed in Japanese Laid Open Patent Application (JP-A-Heisei 8-273355). In this reference, a control timing generating circuit (1) stops the issue of a control timing signal to a memory module set to a use impossible state by a user. A gate control circuit 2 generates a gate signal to gate circuits (7) to (10) to gates clocks signal so that the supply of the clock signal to the use impossible memory module is restrained. DRAMs (3) to (6) recognize the use impossible state when the supply of the clock signals are restrained, and stops the operation. then, the DRAMs carry out enforced refreshing operation at a constant period. Thus, when a memory module of the DRAMs is set to the use impossible state, the reduction of power consumption, the preservation of data and the overhead removal in case of use resumption can be attained.

Also, a synchronous-type semiconductor device is disclosed in Japanese Laid Open Patent Application (JP-A-Heisei 9-69285). In this reference, the synchronous-type semiconductor memory device can take either of a CSUS mode and a power down mode (PD mode) to make a predetermined circuit operation invalid when the memory device operates in synchronous with a clock signal which is externally supplied, and an external signal CKE is in a high level. A signal generation circuit (120) generates an internal signal (rasdz signal) which is switched from a first state to a second state at the timing with a predetermined delay after an internal RAS signal (rasdz signal) is switched from the first state to the second state. The internal RAS (rasdz signal) can take the first state and the second state in which the non-output state of data is permitted. A timing control circuit (104) makes a power down mode (PD mode) valid in synchronous with the clock signal when the internal signal (rasdz signal) generated by the signal generating circuit (120) takes the second state while the above external signal CKE is in the high level. Limitation to input timing of the external signal is released as less as possible.

Also, a semiconductor memory device is disclosed in Japanese Laid Open Patent Application (JP-A-Heisei 11-66842). In this reference, a power down control circuit (52) generates a power down control signal PDENTRn which is in a low level during a refreshing operation at least, from a signal CONT.PIN which is generated based on the outputs of buffer circuits of a semiconductor memory device and defines a period of the refreshing operation. The power down control signal PDENTRn is supplied to the buffer circuits (41 to 46, 48 and 49). The buffers of an input reception section (1) other than a CKE buffer in which the power down control signal PDENTRn is in the low level are fixed to a low level to never receive input signals to external pins. Thus, only a circuit necessary for the refreshing operation operates so that power consumption can be reduced.

Also, a semiconductor memory unit is disclosed in Japanese Laid Open Patent Application (JP-A-Heisei 11-66849). In this reference, a power down control circuit (14) sets a power down signal /PDENTR to a high level to release a power down mode when a clock enable signal CKE asynchronous with a clock signal goes to a high level. When the power down mode is released, a clock control circuit (13) release a mask signal /CLKMSK and a clock driving circuit (12) outputs an internal clock signal CP1 to enable an output of a command decoder (43) to be latched.

Also, selective power down for a high performance CPU/system is disclosed in Japanese Laid Open Patent Application (JP-A-Heisei 7-505244corresponding to WO93/20498). In this reference, a microelectronic apparatus is composed of two functional units formed on a single chip or die. In execution of a computer program for controlling the microelectronic apparatus, all the units do not operate at a time. Therefore, each of the units is turned on or off based on the executed program. This is achieved through one of the following three schemes: stopping the supply of a clock signal to a functional unit, stopping the supply of power to the functional unit, and stopping the supply of an input signal to the functional unit.

SUMMARY OF THE INVENTION

Therefore, an object of the present invention is to provide a semiconductor device which can save power consumption.

Another object of the present invention is to provide a synchronous type semiconductor memory which consume both an AC current and a DC current only when a command CMD is supplied.

Still another object of the present invention is to provide a semiconductor memory using the above synchronous type semiconductor memories.

In order to achieve an aspect of the present invention, a synchronous type dynamic random access memory (SDRAM) includes a memory cell array section having an address decoder section and a sense amplifier section, a power down signal generating section, a control signal generating section and an accessing section. The power down signal generating section generates a first power down signal and a second power down signal based on a clock enable signal, an external clock signal, a signal specific to the SDRAM and a write burst signal. The first power down signal is inactive during a predetermined time period synchronous with the specific signal, and the second power down signal is inactive during a time period during which the write burst signal is supplied. The control signal generating section generates a control signal based on a command signal when the first power down signal is inactive. The accessing section accesses the memory cell array section based on an external address signal and an external data signal in response to the control signal when the first power down signal or the second power down signals is inactive.

Here, the specific signal may be an external chip select signal indicating that the SDRAM is selected. In this case, the power down signal generating section may include a power down control section, a first buffer circuit, a second buffer circuit and an input buffer activating circuit. The power down control section generates a power down clock signal based on the clock enable signal, and the power down clock signal is inactive when the clock enable signal is active. The first buffer circuit outputs an internal clock signal from the external clock signal when the power down clock signal is inactive, and the internal clock signal is not outputted when the power down clock signal is active. The second buffer circuit outputs an internal chip select signal in response to the external chip select signal when the power down clock signal is inactive. The internal chip select signal is not outputted when the power down clock signal is inactive. The input buffer activating circuit generates the first and second power down signals based on the internal chip select signal, the internal clock signal and the write burst signal when the power down clock signal is inactive. The first and second power down signals are not generated when the power down clock signal is active.

Also, the control signal generating section may include a third buffer circuit, a command decoder and a control logic circuit. The third buffer circuit outputs an internal command signal in response to the external command signal when the first power down signal is inactive, and the internal command signal is not outputted when the first power down signal is active. The command decoder decodes the internal command signal. The control logic circuit generates the control signal based on the decoding result of the internal command signal by the command decoder.

Also, the accessing section may include a fourth buffer circuit, a fifth buffer circuit, an address pre-decoder, a data write circuit, a data read circuit and an output buffer circuit. The fourth buffer circuit outputs an internal address signal in response to the external address signal when the first power down signal is inactive, and the internal address signal is not outputted when the first power down signal is active. The fifth buffer circuit outputs an internal data signal from the external data signal when the second power down signal is inactive, and the internal data signal is not outputted when the second power down signal is active. The address pre-decoder pre-decodes the internal address signal in response to the control signal and outputting the pre-decoding result to the address decoder section of the memory cell array section. The data write circuit writes data corresponding to the internal data signal in the memory cell array section based on the pre-decoding result in response to the control signal. The data read circuit reads out data from the memory cell array section based on the pre-decoding result in response to the control signal. The output buffer circuit outputs the read out data.

Also, the input buffer activating circuit may include a holding circuit section, a first NAND gate circuit and a second NAND gate circuit. The holding circuit section generates a hold signal indicating during the predetermined time period that the specific signal becomes active once. The first NAND gate circuit calculates the hold signal and the specific signal to generate the first power down signal. The second NAND gate circuit calculates the hold signal, the specific signal and the burst signal to generate the second power down signal.

In another aspect of the present invention, a method of carrying out power saving in a synchronous type dynamic random access memory (SDRAM) is attained by generating a first power down signal and a second power down signal based on a clock enable signal, an external clock signal, a signal specific to the SDRAM and a write burst signal, wherein the first power down signal is inactive during a predetermined time period synchronous with the specific signal, and the second power down signal is inactive during a time period during which a write burst signal is supplied; by generating a control signal based on a command signal when the first power down signal is inactive; by generating an internal address signal from an external address signal for accessing a memory cell array section based on the control signal when the first power down signal is inactive; by generating an internal write data signal from an external write data signal for accessing the memory cell array section based on the control signal when the second power down signal is inactive; and by generating an external read data signal from an internal read data signal read out from the memory cell array section based on the control signal.

Also, the method may further includes: stopping the generation of the control signal to save power when the first power down signal is active.

Also, the method may further includes: stopping the generation of the internal address signal to save power when the first power down signal is active; and stopping the generation of the internal data signal to save power when the second power down signal is active.

Also, the specific signal may be an external chip select signal indicating that the SDRAM is selected. In this case, the generating a first power down signal and a second power down signal may be attained by generating a power down clock signal based on the clock enable signal, wherein the power down clock signal is inactive when the clock enable signal is active; by generating an internal clock signal from the external clock signal when the power down clock signal is inactive; by generating an internal chip select signal from the external chip select signal when the power down clock signal is inactive; and by generating the first and second power down signals based on the internal chip select signal, the internal clock signal and the write burst signal when the power down clock signal is inactive. Also, the generating a first power down signal and a second power down signal may further include: stopping the internal clock signal from the external clock signal when the power down clock signal is active; and stopping the generation of the internal chip select signal from the external chip select signal when the power down clock signal is active. Also, the generating a first power down signal and a second power down signal may further include: stopping the generation of the first and second power down signals when the power down clock signal is active.

Also, the generating the first and second power down signals may be attained by generating a hold signal indicating during the predetermined time period that the internal chip select signal becomes active once; by calculating the hold signal and the internal chip select signal to generate the first power down signal; and by calculating the hold signal, the internal chip select signal and the burst signal to generate the second power down signal.

In order to achieve still another aspect of the present invention, a memory (SDRAM) system includes a plurality of synchronous type dynamic random access memories (SDRAMs), signals specific to the SDRAMs being supplied to the SDRAMs, a bus connected to the plurality of SDRAMs, and a control unit. The control unit transfers an external clock enable signal, an external clock signal, an external command signal, an external address signal and a data signal in common to the plurality of synchronous type dynamic random access memories via the bus and respectively transfers the specific signals to the plurality of synchronous type dynamic random access memories. Each of the plurality of synchronous type dynamic random access memories include a memory cell array section having an address decoder section and a sense amplifier section, a power down signal generating section, a control signal generating section and an accessing section. The power down signal generating section generates a first power down signal and a second power down signal based on a clock enable signal, an external clock signal, a signal specific to the SDRAM and a write burst signal. The first power down signal is inactive during a predetermined time period synchronous with the specific signal, and the second power down signal is inactive during a time period during which the write burst signal is supplied. The control signal generating section generates a control signal based on a command signal when the first power down signal is inactive. The accessing section accesses the memory cell array section based on an external address signal and an external data signal in response to the control signal when the first power down signal or the second power down signals is inactive.

Here, the specific signal may be an external chip select signal indicating that the SDRAM is selected. In this case, the power down signal generating section may include a power down control section, a first buffer circuit, a second buffer circuit and an input buffer activating circuit. The power down control section generates a power down clock signal based on the clock enable signal, and the power down clock signal is inactive when the clock enable signal is active. The first buffer circuit outputs an internal clock signal from the external clock signal when the power down clock signal is inactive, and the internal clock signal is not outputted when the power down clock signal is active. The second buffer circuit outputs an internal chip select signal in response to the external chip select signal when the power down clock signal is inactive. The internal chip select signal is not outputted when the power down clock signal is inactive. The input buffer activating circuit generates the first and second power down signals based on the internal chip select signal, the internal clock signal and the write burst signal when the power down clock signal is inactive. The first and second power down signals are not generated when the power down clock signal is active.

Also, the control signal generating section may include a third buffer circuit, a command decoder and a control logic circuit. The third buffer circuit outputs an internal command signal in response to the external command signal when the first power down signal is inactive, and the internal command signal is not outputted when the first power down signal is active. The command decoder decodes the internal command signal. The control logic circuit generates the control signal based on the decoding result of the internal command signal by the command decoder.

Also, the accessing section may include a fourth buffer circuit, a fifth buffer circuit, an address pre-decoder, a data write circuit, a data read circuit and an output buffer circuit. The fourth buffer circuit outputs an internal address signal in response to the external address signal when the first power down signal is inactive, and the internal address signal is not outputted when the first power down signal is active. The fifth buffer circuit outputs an internal data signal from the external data signal when the second power down signal is inactive, and the internal data signal is not outputted when the second power down signal is active. The address pre-decoder pre-decodes the internal address signal in response to the control signal and outputting the pre-decoding result to the address decoder section of the memory cell array section. The data write circuit writes data corresponding to the internal data signal in the memory cell array section based on the pre-decoding result in response to the control signal. The data read circuit reads out data from the memory cell array section based on the pre-decoding result in response to the control signal. The output buffer circuit outputs the read out data.

Also, the input buffer activating circuit may include a holding circuit section, a first NAND gate circuit and a second NAND gate circuit. The holding circuit section generates a hold signal indicating during the predetermined time period that the specific signal becomes active once. The first NAND gate circuit calculates the hold signal and the specific signal to generate the first power down signal. The second NAND gate circuit calculates the hold signal, the specific signal and the burst signal to generate the second power down signal.

DESCRIPTION OF THE PREFERRED EMBODIMENTS

Hereinafter, a semiconductor device such as a synchronous type semiconductor memory and a memory system using such synchronous type semiconductor memories will be described below in detail with reference to the attached drawings.

Figure 5:
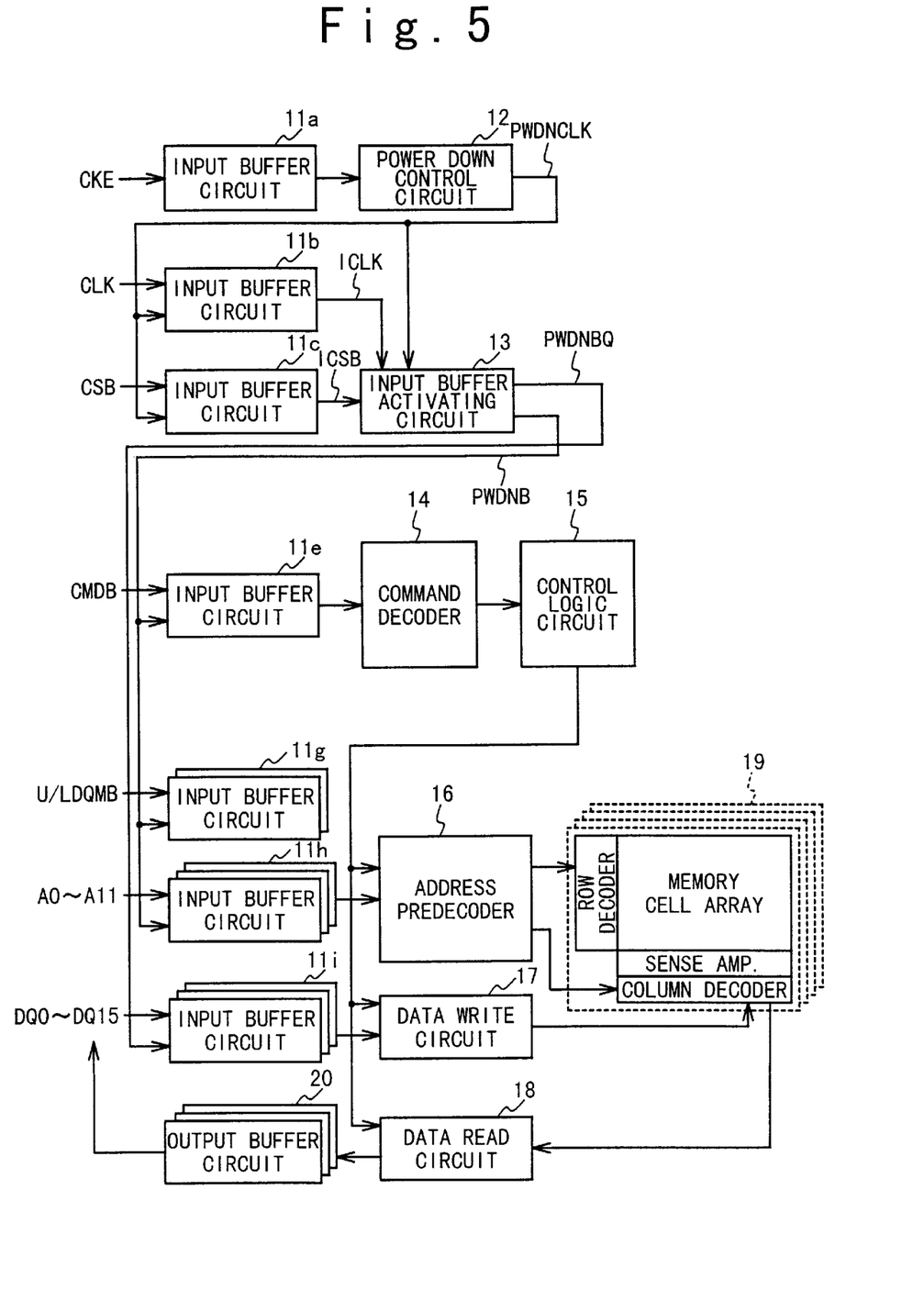
FIG. 5 is a block diagram showing a synchronous type semiconductor memory according to an embodiment mode of the present invention.

FIG. 5 shows the structure of the synchronous type semiconductor memory according to an embodiment of the present invention. Referring to FIG. 5, the synchronous type semiconductor memory is composed of input buffer circuits 11a to 11c and 11e to 11i, a power down control circuit 12, an input buffer activating circuit 13, a command decoder 14, a control logic circuit 15, an address pre-decoder 16, a data writing circuit 17, a data reading circuit 18, memory cell blocks 19, and an output buffer circuit 20. The input buffer circuits 11b, 11c, 11e, 11g, 11h and 11i have the same structure that of FIG. 4. It should be noted that the input buffer circuit 11i is supplied with a power down signal PWDNBQ in place of a power down signal PWDNB.

The input buffer circuit 11a receives a clock enable signal CKE to supply to the power down control circuit 12. The power down control circuit 12 set a power down clock signal PWDNCLK to an inactive state when the clock enable signal CKE rises to the high level. The power down clock signal PWDNCLK is reset to an active state in response to the falling edge of the clock enable signal CKE regardless of a clock CLK. Thus, the input buffer circuit 11a stops the operation to save power consumption.

The input buffer circuit 11b inputs the external clock signal CLK, and outputs an internal clock signal ICLK in synchronous with the external clock signal CLK, when the power down clock signal PWDNCLK is in the inactive state. However, the input buffer circuit 11b stops the operation to save power consumption in response to the transition of the power down clock signal PWDNCLK to the active state.

Thus, the internal clock signal ICLK from the input buffer circuit 11b goes to the low level.

When the power down clock signal PWDNCLK is set to the inactive state, the input buffer circuit 11c inputs an external chip select signal CSB to specific to the synchronous type dynamic random access memory. Then, the input buffer circuit 11c outputs an internal chip select signal ICSB which is synchronous with the external chip select signal CSB. However, the input buffer circuit 11c stops the operation to save power consumption in response to the transition of the power down clock signal PWDNCLK to the active state. Thus, the internal chip select signal ICSB from the input buffer circuit 11c goes to the high level.

The input buffer activating circuit 13 enters the power down clock signal PWDNCLK, the internal clock signal ICLK, the internal chip select signal ICSB and a set of a write burst signal WBST and a burst signal BURST (both not shown). In case that the power down clock signal PWDNCLK is set to the inactive state, the input buffer activating circuit 13 outputs the power down signals PWDNB and PWDNBQ based on the entered signals. The power down signals PWDNB and PWDNBQ have high or low levels in conjunction with the internal chip select signal ICSB. It should be noted that the power down signal PWDNBQ is set to the inactive high level only when an external command CMD commands a writing operation.

The input buffer circuits 11e, 11g, and 11h are activated in response to the power down signal PWDNB in the inactive state, so that a command CMDB, a data mask signal U/LDQMB, and address signals A0 to A11 can be inputted to the input buffer circuits 11e, 11g, and 11h. When the power down signal PWDNB is in the active state, the input buffer circuits 11e, 11g, and 11h are deactivated to save power consumption. The input buffer circuit 11i is activated in response to the power down signal PWDNBQ in the inactive state of the high level, so that a data signal DQ0 to DQ15 is inputted to the input buffer circuit 11i. However, when the power down signal PWDNBQ is in the active state of the low level, i.e., in the writing operation, the input buffer circuit 11i is deactivated to save power consumption.

The command decoder 14 decodes the command CMDB supplied through the input buffer circuit 11e, and then outputs the decoded result to the control logic circuit 15. The control logic circuit 15 generates a control signal based on the decoded result and controls the address pre-decoder 16, the data writing circuit 17, and the data reading circuit 18 based on the control signal.

The address pre-decoder 16 decodes an address signal supplied through the input buffer circuit 11h to specify an address of memory cells. Thereafter, the address pre-decoder 16 outputs the decoded result to a row decoder and a column decoder in the memory cell block 19.

The input buffer circuit 11i inputs the data signal DQ0 to DQ15 when the power down signal PWDNBQ is in the inactive state of the high level in the writing operation. The input buffer circuit 11i does not input the data signal DQ0 to DQ15 when the power down signal PWDNBQ is in the active state of the low level in the reading operation. Thus, power consumption is saved.

When the decoded result of the command decoder 14 specifies the data writing operation, the data writing circuit 17 writes the data DQ0 through DQ15 supplied through the input buffer circuit 11i in the memory cell block 19 by use of a sense amplifier section thereof. When the decoded result of the command decoder 14 specifies the data reading operation, the data reading circuit 18 reads the data from a relevant address of the memory cell block 19, and then externally outputs the read data through the output buffer circuit 20.

Figure 6A:
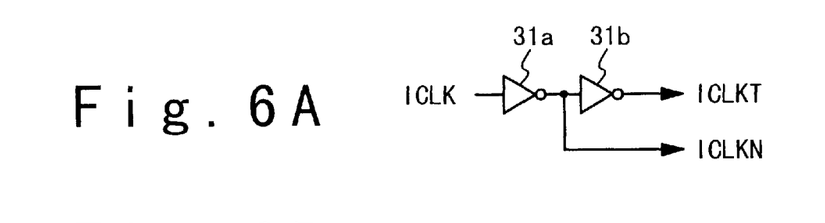
FIGS. 6A and 6B are circuit diagrams of an input buffer activating circuit employed in the synchronous type semiconductor memory of FIG. 5.
Figure 6B:
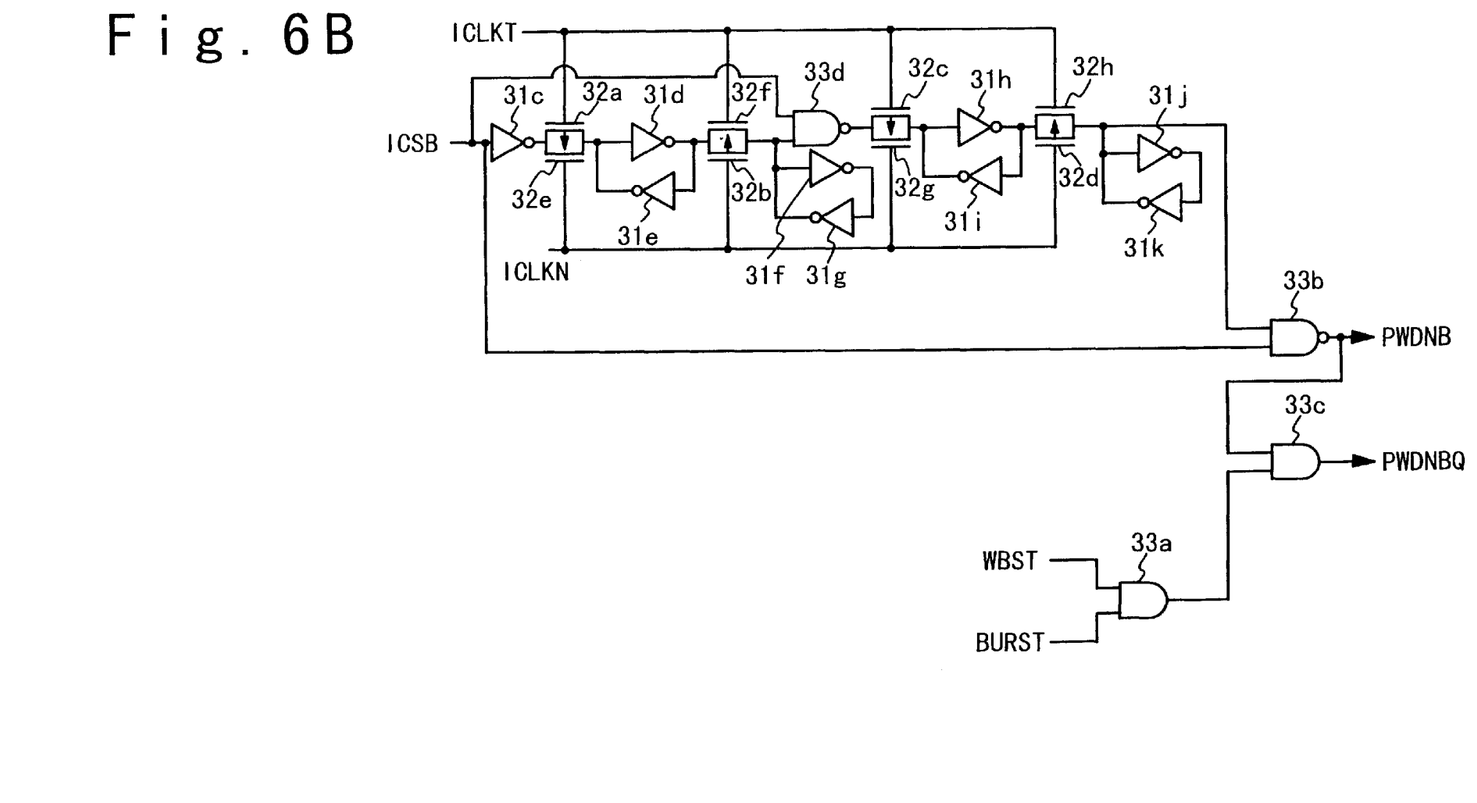

FIGS. 6A and 6B are circuit diagrams showing the structure of the above-explained input buffer activating circuit 13. The internal clock signal ICLK outputted from the input buffer circuit 11b is inverted by an inverter 31a. Thus, an internal clock signal ICLKN is produced. The internal clock signal ICLKN is further inverted by an inverter 31b. Thus, another internal clock signal ICLKT is produced. The inverters 31a and 31b are activated in accordance with the power down clock signal PWDNCLK.

A P-channel type transistor 32a and an N-channel type transistor 32e constitute a first transfer gate. A P-channel type transistor 32b and an N-channel type transistor 32f constitute a second transfer gate. A P-channel type transistor 32c and an N-channel type transistor 32g constitute a third transfer gate. A P-channel type transistor 32d and an N-channel type transistor 32h constitute a fourth transfer gate. The P-channel type transistors 32a and 32c and the N-channel type transistors 32f and 32h are connected to the internal clock signal ICLKT. The P-channel type transistors 32b and 32d and the N-channel type transistors 32e and 32g are connected to the internal clock signal ICLKN. A first latch circuit of inverters 31d and 31e is provided between the first and second transfer gates. A second latch circuit of inverters 31f and 31g is provided at the output of the second transfer gate, and a third latch circuit of inverters 31h and 31i is provided at the output of the third transfer gate. Also, a fourth latch circuit of inverters 31j and 31k is provided at the output of the fourth transfer gate. Thus, a data holding circuit similar to a shift register is formed.

In this circuit, the internal chip select signal ICSB is supplied to an inverter 31c. In case that the internal chip select signal ICSB is in the low level and the internal clock signal ICLKN is in the high level, namely the internal clock signal ICLK is in the low level, the first transfer gate is set to an ON state. Thus, the output of the inverter 31c to the first transfer gate is latched by the first latch circuit and then is transferred to the second transfer gate through the inverter 31d. When the internal clock signal ICLK is switched to the high level, the first transfer gate is set to an OFF state, and the second transfer gate is set to an ON state. Thus, the output of the inverter 31d is supplied to the second latch circuit and a NAND gate circuit 33d. At this time, the internal chip select signal ICSB is also supplied to the NAND gate circuit 33d.

The output of the NAND gate circuit 33d is supplied to a NAND gate circuit 33b through the third transfer gate, the inverter 31h of the third latch circuit and the fourth transfer gate. Also, the internal chip select signal ICSB is also supplied directly to the NAND gate circuit 33d. Thus, the NAND gate circuit 33d produces the power down signal PWDNB.

A write burst signal WBST is set to the high level when a write command CMD is supplied. A signal BURST is set to the high level during a burst period. The write burst signal WBST and the signal BURST are supplied to an AND gate circuit 33a. The output of the AND gate circuit 33a is supplied to an AND gate circuit 33c. Also, the output of the NAND gate circuit 33b is supplied to the AND gate circuit 33c. Thus, the AND gate circuit 33c produces the power down signal PWDNBQ which becomes active in the writing operation.

Next, referring now to FIGS. 7A to 7K, operations of the synchronous type dynamic random access memories will be described. In this case, the synchronous type dynamic random access memories forms a memory system as shown in FIG. 4.

Figures 7A, 7B:
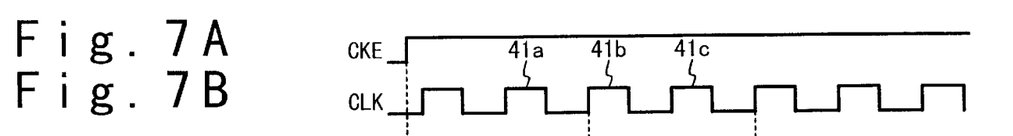
FIGS. 7A to 7K are timing charts showing an operation of the synchronous type semiconductor memory shown in FIG. 5.
Figure 7C:
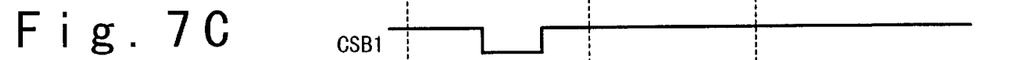
Figure 7D:
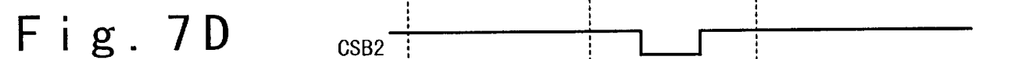
Figure 7E:
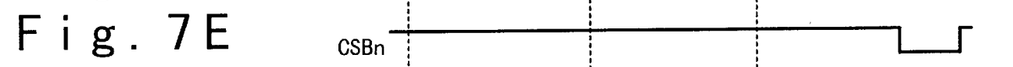
Figures 7F, 7G:
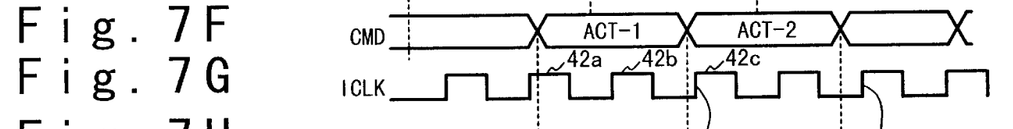
Figures 7H, 7I:
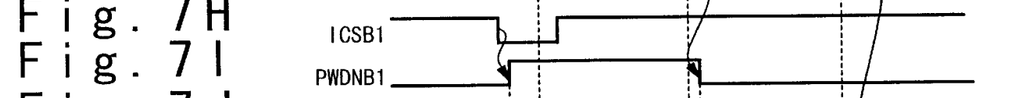

When the clock enable signal CKE goes to the high level as shown in FIG. 7A, the power down clock signal is set to the inactive state, so that the internal clock ICLK is generated in synchronous with the external clock signal CLK, as shown in FIG. 7G. When the external chip select signal CSB1 is set to the low level for one cycle (in this case, power consumption is minimized) as shown in FIG. 7C, the internal chip select signal ICSB1 is set to the low level in conjunction with the external chip select signal CSB1, as shown in FIG. 7H. At that time, the power down signal PWDNB1 is set to the inactive state of the high level through the operation of the NAND circuit 33b, as shown in FIG. 7I. It is supposed that the chip select signal CSB1 is set to the low level during a cycle 41a. In this case, the power down signal PWDNB1 is set to the inactive state of the high level at a cycle 42a corresponding to the cycle 41a. Also, the power down signal PWDNB1 is held at a high level until the clock signal ICLK of FIG. 7G goes to the high level in another cycle 42c corresponding to a cycle 41c. That is, the power down signal PWDNB1 is held until the internal clock signal ICLK becomes a high level after the two cycles from the cycle 42a. As a consequence, since the input buffer circuit lie is activated in a cycle 41b, the command CMD can be inputted to the input buffer circuit lie in this cycle 41b, as shown in FIG. 7F. Thus, a command ACT-1 is supplied to the command decoder 14.

Next, an occurrence condition of current consumption will now be described. An AC current is generated only in the synchronous type semiconductor memory 1 to which the external chip select signal CSB1 is supplied. The external chip select signal CSB1 is supplied at timing when the command signal CMD is transferred within a time period during which the power down signal PWDNB1 is in the inactive state of the high level. In this way, the input buffer circuits 11e, 11g, 11h and 11i are made active only in the synchronous type semiconductor memory 1 within a time period during which the power down signal PWDNB1 is set to the inactive state of the high level. In the example shown in FIGS. 7A to 7K, the power down signal PWDNB1 overlaps with the power down signal PWDNB2 during a time period in the high level. During this overlapping time period, the input buffer circuits 11e, 11g, 11h and 11i are made active in both of the synchronous type semiconductor memories 1 and 2.

Figures 7J, 7K:
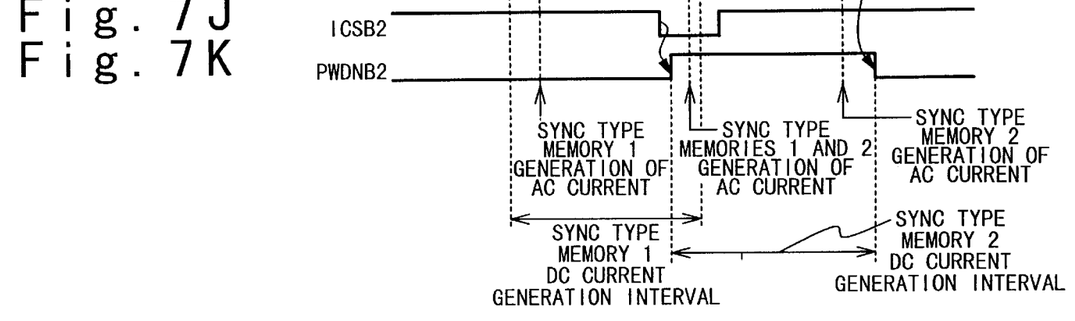

As previously explained, the external chip select signal CSB is set to the low level only for one cycle. Since the power down signal PWDNB is set to the inactive state for three or less cycles in conjunction with the external chip select signal CSB, minimum current consumption can be achieved. The command signal CMD requires a set-up time defined until the operation of the input stage becomes stable after the power down signal PWDNB is set to the high level. Therefore, it is preferable that the command signal CMD is supplied in the cycle 41b which is delayed by one cycle from the chip select signal CSB. In case that the command signal CMD (ACT-1) is supplied to the memory chip in the cycle 41b, the command CMD is latched in the memory chip when the internal clock signal ICLK is set to the high level in the cycle 42c. As a consequence, the input buffer circuit is required to be in the active state until the internal clock ICLK goes to the high level.

It should also be noted that the power down signal PWDNBQ may be operated in a similar manner to that of the power down signal PWNB, and is brought into a high state only during the write burst period.

Also, it is conceivable that both of the power down signals PWDNB and PWDNBQ may be generated by use of a signal other than the chip select signal CSB. That is to say, if a signal which is specifically supplied to the synchronous type semiconductor memories (SDRAMs) 1 to n is present other than the chip select signal CSB, then this signal may be employed instead of the chip select signal CSB. Also, the cycle in which the chip select signal CSB is brought into a low level is not limited only to one cycle. Also, there is no limitation in a time duration for which the command signal CMD is supplied after the chip select signal CSB has been set to the low level. Furthermore, the time duration for which the power down signal PWDNB is held at the high level is not limited to the time duration as described in the above-described embodiment, but may be set to an optimum time duration, depending upon the design needs.

As previously explained, the synchronous type semiconductor memory and the memory system of the present invention can has the following effects. That is, only the synchronous type semiconductor memory to which the command signal CMD is inputted consumes both of the AC current and the DC current. Therefore, the current consumption of a memory system for mounting thereon a plurality of synchronous semiconductor memory can be reduced.

What is claimed is:

1. A synchronous type dynamic random access memory (SDRAM) comprising:
   a memory cell array section having an address decoder section and a sense amplifier section;
   a power down signal generating section generating a first power down signal and a second power down signal based on a clock enable signal, an external clock signal, a signal specific to said SDRAM and a write burst signal, wherein said first power down signal is inactive during a predetermined time period synchronous with said specific signal, and said second power down signal is inactive during a time period during which said write burst signal is supplied;
   a control signal generating section generating a control signal based on a command signal when said first power down signal is inactive; and
   an accessing section accessing said memory cell array section based on an external address signal and an external data signal in response to said control signal when said first power down signal or said second power down signals is inactive.

2. A synchronous type dynamic random access memory according to claim 1, wherein said specific signal is an external chip select signal indicating that said SDRAM is selected.

3. A synchronous type dynamic random access memory according to claim 2, wherein said power down signal generating section includes:
   a power down control section generating a power down clock signal based on said clock enable signal, wherein said power down clock signal is inactive when said clock enable signal is active;
   a first buffer circuit outputting an internal clock signal from said external clock signal when said power down clock signal is inactive, wherein said internal clock signal is not outputted when said power down clock signal is active;
   a second buffer circuit outputting an internal chip select signal in response to said external chip select signal when said power down clock signal is inactive, wherein said internal chip select signal is not outputted when said power down clock signal is inactive; and an input buffer activating circuit generating said first and second power down signals based on said internal chip select signal, said internal clock signal and said write burst signal when said power down clock signal is inactive, wherein said first and second power down signals are not generated when said power down clock signal is active.

4. A synchronous type dynamic random access memory according to claim 1, wherein said control signal generating section includes:

a third buffer circuit outputting an internal command signal in response to said external command signal when said first power down signal is inactive, wherein said internal command signal is not outputted when said first power down signal is active;

a command decoder decoding said internal command signal; and a control logic circuit generating said control signal based on the decoding result of said internal command signal by said command decoder.

5. A synchronous type dynamic random access memory according to claim 1, wherein said accessing section includes:

a fourth buffer circuit outputting an internal address signal in response to said external address signal when said first power down signal is inactive, wherein said internal address signal is not outputted when said first power down signal is active;

a fifth buffer circuit outputting an internal data signal from said external data signal when said second power down signal is inactive, wherein said internal data signal is not outputted when said second power down signal is active;

an address pre-decoder pre-decoding said internal address signal in response to said control signal and outputting the pre-decoding result to said address decoder section of said memory cell array section;

a data write circuit writing data corresponding to said internal data signal in said memory cell array section based on the pre-decoding result in response to said control signal;

a data read circuit reading out data from said memory cell array section based on the pre-decoding result in response to said control signal; and an output buffer circuit outputting said read out data.

6. A synchronous type dynamic random access memory according to claim 1, wherein said input buffer activating circuit includes:

a holding circuit section generating a hold signal indicating during said predetermined time period that said specific signal becomes active once;

a first NAND gate circuit calculating said hold signal and said specific signal to generate said first power down signal; and a second NAND gate circuit calculating said hold signal, said specific signal and said burst signal to generate said second power down signal.

7. A method of carrying out power saving in a synchronous type dynamic random access memory (SDRAM) comprising:

generating a first power down signal and a second power down signal based on a clock enable signal, an external clock signal, a signal specific to said SDRAM and a write burst signal, wherein said first power down signal is inactive during a predetermined time period synchronous with said specific signal, and said second power down signal is inactive during a time period during which a write burst signal is supplied;

generating a control signal based on a command signal when said first power down signal is inactive;

generating an internal address signal from an external address signal for accessing a memory cell array section based on said control signal when said first power down signal is inactive;

generating an internal write data signal from an external write data signal for accessing said memory cell array section based on said control signal when said second power down signal is inactive; and generating an external read data signal from an internal read data signal read out from said memory cell array section based on said control signal.

8. A method according to claim 7, further comprising:

stopping the generation of said control signal to save power when said first power down signal is active.

9. A method according to claim 7, further comprising:

stopping the generation of said internal address signal to save power when said first power down signal is active; and stopping the generation of said internal data signal to save power when said second power down signal is active.

10. A method according to claim 7, wherein said specific signal is an external chip select signal indicating that said SDRAM is selected.

11. A method according to claim 10, wherein said generating a first power down signal and a second power down signal includes:

generating a power down clock signal based on said clock enable signal, wherein said power down clock signal is inactive when said clock enable signal is active;

generating an internal clock signal from said external clock signal when said power down clock signal is inactive;

generating an internal chip select signal from said external chip select signal when said power down clock signal is inactive; and generating said first and second power down signals based on said internal chip select signal, said internal clock signal and said write burst signal when said power down clock signal is inactive.

12. A method according to claim 11, wherein said generating a first power down signal and a second power down signal further includes:

stopping said internal clock signal from said external clock signal when said power down clock signal is active; and stopping the generation of said internal chip select signal from said external chip select signal when said power down clock signal is active.

13. A method according to claim 11, wherein said generating a first power down signal and a second power down signal further includes:

stopping the generation of said first and second power down signals when said power down clock signal is active.

14. A method according to claim 11, wherein said generating said first and second power down signals includes:

generating a hold signal indicating during said predetermined time period that said internal chip select signal becomes active once;

calculating said hold signal and said internal chip select signal to generate said first power down signal; and calculating said hold signal, said internal chip select signal and said burst signal to generate said second power down signal.

15. A memory (SDRAM) system comprising:

a plurality of synchronous type dynamic random access memories (SDRAMs), signals specific to said SDRAMs being supplied to said SDRAMs;

a bus connected to said plurality of SDRAMs;

a control unit transferring an external clock enable signal, an external clock signal, an external command signal, an external address signal and a data signal in common to said plurality of synchronous type dynamic random access memories via said bus and respectively transferring said specific signals to said plurality of synchronous type dynamic random access memories, and wherein each of said plurality of synchronous type dynamic random access memories comprises:

a memory cell array section having an address decoder section and a sense amplifier section;

a power down signal generating section generating a first power down signal and a second power down signal based on said external clock enable signal, said external clock signal, said specific signal and a write burst signal, wherein said first power down signal is inactive during a predetermined time period synchronous with said specific signal, and said second power down signal is inactive during a time period during which said write burst signal is supplied;

a control signal generating section generating a control signal based on a command signal when said first power down signal is inactive; and an accessing section accessing said memory cell array section based on said external address signal and said external data signal in response to said control signal when said first power down signal is inactive in a read mode and said second power down signals is inactive in a write mode.

16. A memory system according to claim 15, wherein said specific signal is an external chip select signal indicating that said SDRAM is selected.

17. A memory system according to claim 16, wherein said power down signal generating section includes:

a power down control section generating a power down clock signal based on said external clock enable signal, wherein said power down clock signal is inactive when said external clock enable signal is active;

a first buffer circuit outputting an internal clock signal from said external clock signal when said power down clock signal is inactive, wherein said internal clock signal is not outputted when said power down clock signal is active;

a second buffer circuit outputting an internal chip select signal in response to said external chip select signal when said power down clock signal is inactive, wherein said internal chip select signal is not outputted when said power down clock signal is inactive; and an input buffer activating circuit generating said first and second power down signals based on said internal chip select signal, said internal clock signal and said write burst signal when said power down clock signal is inactive, wherein said first and second power down signals are not generated when said power down clock signal is active.

18. A memory system according to claim 15, wherein said control signal generating section includes:

a third buffer circuit outputting an internal command signal in response to said external command signal when said first power down signal is inactive, wherein said internal command signal is not outputted when said first power down signal is active;

a command decoder decoding said internal command signal; and a control logic circuit generating said control signal based on the decoding result of said internal command signal by said command decoder.

19. A memory system according to claim 15, wherein said accessing section includes:

a fourth buffer circuit outputting an internal address signal in response to said external address signal when said first power down signal is inactive, wherein said internal address signal is not outputted when said first power down signal is active;

a fifth buffer circuit outputting an internal data signal from said external data signal when said second power down signal is inactive, wherein said internal data signal is not outputted when said second power down signal is active;

an address pre-decoder pre-decoding said internal address signal in response to said control signal and outputting the pre-decoding result to said address decoder section of said memory cell array section;

a data write circuit writing data corresponding to said internal data signal in said memory cell array section based on the pre-decoding result in response to said control signal;

a data read circuit reading out data from said memory cell array section based on the pre-decoding result in response to said control signal; and an output buffer circuit outputting said read out data.

20. A memory system according to claim 15, wherein said input buffer activating circuit includes:

a holding circuit section generating a hold signal indicating during said predetermined time period that said specific signal becomes active once;

a first NAND gate circuit calculating said hold signal and said specific signal to generate said first power down signal; and a second NAND gate circuit calculating said hold signal, said specific signal and said burst signal to generate said second power down signal.

* * * * *